United States Patent [19]
Fahey et al.

[11] Patent Number: 5,239,443
[45] Date of Patent: Aug. 24, 1993

[54] BLIND HOLE COLD PLATE COOLING SYSTEM

[75] Inventors: Albert J. Fahey, Pleasant Valley; Gaetano P. Messina, Hopewell Junction; John B. Pavelka, Beacon; Raed A. Sherif, Pleasant Valley, all of N.Y.

[73] Assignee: International Business Machines Corporation, Armonk, N.Y.

[21] Appl. No.: 872,567

[22] Filed: Apr. 23, 1992

[51] Int. Cl.⁵ ............................................. H05K 7/20
[52] U.S. Cl. ..................... 361/689; 165/80.4; 361/699
[58] Field of Search ................... 62/414, 418; 165/104.33, 80.4, 185, 908; 357/82; 174/15.1, 16.3; 361/382, 385–389; 257/706, 707, 712–714

[56] References Cited

U.S. PATENT DOCUMENTS

| | | | |
|---|---|---|---|
| 4,188,996 | 2/1980 | Pellant et al. | 165/80 C |
| 4,494,171 | 1/1985 | Bland et al. | 361/386 |
| 4,750,086 | 6/1988 | Mittal | 361/382 |
| 4,910,642 | 3/1990 | Downing | 361/382 |
| 4,928,207 | 5/1990 | Chrysler | 361/385 |
| 5,023,695 | 6/1991 | Umezawa et al. | 357/82 |

OTHER PUBLICATIONS

Chu, et al., "Multi-Chip Package with Cooling by a Spreader Plate in Contact With a Chip Having Cylindrical Holes Mating With an Inverse Frame Providing Water Flow Within Its Pins", IBM Technical Disclosure Bulletin, vol. 31, No. 5, pp. 141–142 (Oct. 1988).

Ostergren, "Mini Conformal Cold Plate", IBM Technical Disclosure Bulletin, vol. 27, No. 1B, pp. 494–495 (Jun. 1984).

*Primary Examiner*—Gerald P. Tolin
*Attorney, Agent, or Firm*—Ira David Blecker

[57] ABSTRACT

Disclosed is a blind hole cold plate cooling system including:
a fluid inlet manifold having at least one jet nozzle;
a heat transfer plate having a first and second principal surface, the first principal surface having a complementary cavity for receiving the jet nozzle, the second principal surface being planar for contact with at least one heat generatinq device; and
an annular gap defined by the outer periphery of jet nozzle and the surface of the complementary cavity.

18 Claims, 2 Drawing Sheets

BLIND HOLE COLD PLATE COOLING SYSTEM

BACKGROUND OF THE INVENTION

The present invention relates to a liquid cooling system for semiconductor devices and similar heat generating devices. More particularly, the invention relates to a liquid cooling system wherein jet impingement and channel flow combine to provide an improved cooling arrangement.

Numerous proposals have been made for removing the heat generated by semiconductor devices.

Chu et al. IBM Technical Disclosure Bulletin, Vol. 31, No. 5, pp. 141-142 (October 1988), disclose a cooling apparatus wherein a heat spreader plate having cavities on its back side is placed in contact with a chip. The cavities are filled with hollow "pins". Within the hollow pins are placed tubes for supplying a cooling fluid. The cooling fluid impinges the inner surface of the hollow pins so as to dissipate heat from the spreader plate which, in turn, is generated by the chip.

Mittal U.S. Pat. No. 4,750,086 discloses an impingement cooling design wherein a heat spreader plate is in contact with a chip. A resilient bellows is utilized to maintain contact between the spreader plate and the chip. Within the bellows, a jet of coolant is impinged against the spreader plate to dissipate the heat generated by the chip.

Pellant et al. U.S. Pat. No. 4,188,996 discloses a cooling element for semiconductor devices. The interior of the cooling element has protrusions which cause a whirling motion of the cooling fluid that is supplied to the cooling element. The exterior of the cooling element is planar and is placed against the semiconductor device.

Bland et al. U.S. Pat. No. 4,494,171 discloses an impingement cooling apparatus. In this apparatus, an heat liberating device is placed against a housing which is impingement cooled from the back side.

Ostergren IBM Technical Disclosure Bulletin, Vol. 27, pp. 494-495 (June 1984), discloses a cooling apparatus consisting of a cold plate in contact with a chip. The back side of the cold plate is impingement cooled.

Notwithstanding the advances made by the prior art cooling arrangements, there still remains a real need for improved cooling of heat generating semiconductor devices.

Accordingly, it is an object of the present invention to have a cooling arrangement which takes advantage of impingement cooling and channel flow cooling to provide improved cooling of semiconductor devices.

This and other objects of the invention will become more apparent after referring to the following specification considered in conjunction with the accompanying drawings.

BRIEF SUMMARY OF THE INVENTION

According to one aspect of the invention, there is disclosed a blind hole cold plate cooling system comprising:
a fluid inlet manifold having a plurality of jet nozzles;
a heat transfer plate having a first and second principal surface, said first principal surface having a complementary number of cavities for receiving the jet nozzles, said second principal surface being planar for contact with at least one heat generating device; and
an annular gap defined by the outer periphery of the jet nozzles and the surface of the cavities.

According to a second aspect of the invention, there is disclosed a blind hole cold plate cooling system comprising:
at least 1 semiconductor device;
a fluid inlet manifold having a plurality of jet nozzles;
heat transfer plate having a first and a second principal surface, said first principal surface having a complementary number of cavities for receiving the jet nozzles, the second principal surface being planar for contact with the semiconductor device; and
an annular gap between the outer periphery of the jet nozzles and the surface of the cavities.

DETAILED DESCRIPTION OF THE INVENTION

Figure 1:
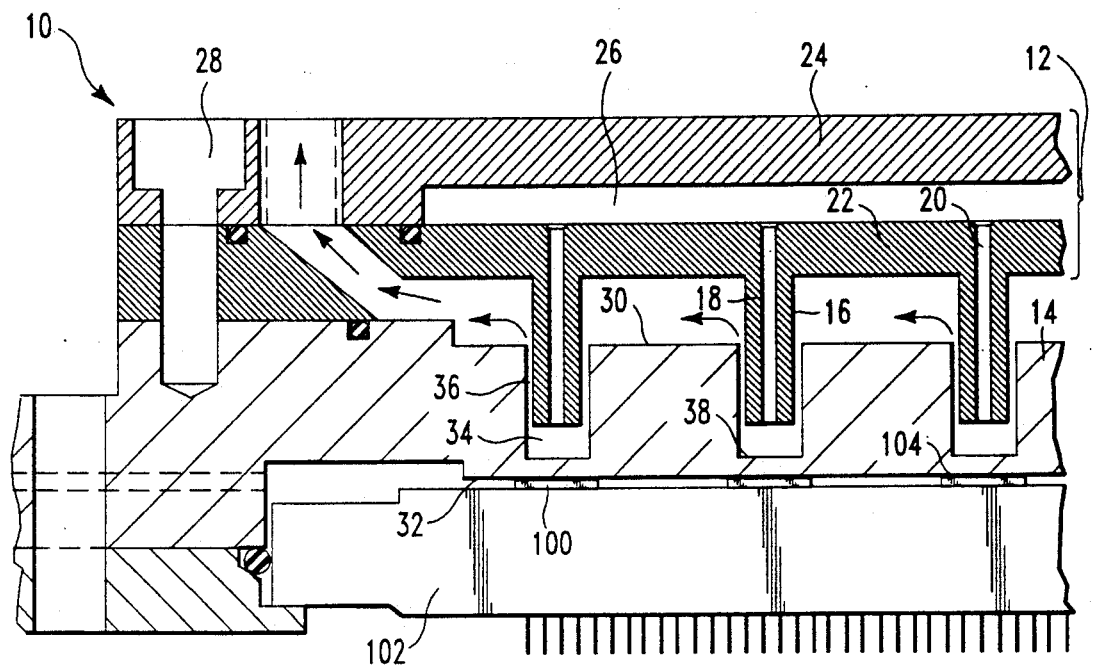
FIG. 1 is a cross section of the blind hole cold plate cooling system according to the present invention.

Referring to the FIGURES in more detail, and particularly referring to FIG. 1, there is disclosed according to the invention a blind hole cold plate cooling system, generally indicated by 10. It is desired to be able to cool at least one heat-generating device 100, such as a semiconductor device, situated on a substrate 102. For purposes of illustration and not limitation, heat-generating device will be assumed to be a semiconductor device and will be referred to as such for the remainder of this specification. It should be understood, however, that the heat-generating device may also be a capacitor, resistor, etc. Usually there will be a plurality of such semiconductor devices 100. There may also be a thermally conductive substance 104 between the semiconductor device 100 and the cooling system 10 to assist in the transfer of heat from the semiconductor device 100.

The cooling system 10 generally includes a fluid inlet manifold 12 and a heat transfer plate 14. The fluid inlet manifold 12 has a plurality of nozzles 16, each of which comprises a body portion 18 and a conduit portion 20. The nozzles are connected together by bottom plate 22. The fluid inlet manifold 12 further comprises a top plate 24. Located within fluid inlet manifold 12 are a fluid inlet 26 and a fluid outlet 28.

Heat transfer plate 14 has a first principal surface 30 and a second principal surface 32. The first principal surface 30 has a plurality of cavities 34 for receiving the nozzles 16. The number of cavities 34 are complementary or equal in number to the number of nozzles 16. The nozzles 16 and complementary cavities 34 are both typically circular in cross section, but they could be other shapes.

Nozzles 16 fit closely into cavities 34 so that there is an annular gap between the outer periphery of the nozzles 16 and the surface of the cavities 34. In a preferred embodiment of the invention, the annular gap is on the order of about 0.2 mm or less and, most preferably, is on the order of about 0.1 mm or less. The reason for the small gap will be explained hereafter.

In operation, a cooling fluid such as water is pumped into fluid inlet 26 which is then fed to conduits 20 in nozzles 16. It is preferred to have the parallel flow of cooling fluid as shown in FIG. 1 for the greatest cooling efficiency. Serial flow, where the cooling fluid flows from chip site to chip site until the last chip site is reached, is not preferred because the cooling fluid is heated towards the end of its flow and, thus, is not as efficient for cooling the latter chip sites. From conduits 20 in nozzles 16, the cooling fluid impinges upon surface 38 of cavities 34 and then exits through annular gap 36 and fluid outlet 28. If desired, the cooling fluid may be cooled upon exiting from fluid outlet 28 by passing it through a chiller or heat exchanger. After cooling, the cooling fluid would be circulated to a circulating pump and then circulated back into fluid inlet 26. The chiller or heat exchanger and circulating pump are well known in the art and so are omitted here.

Figure 2:
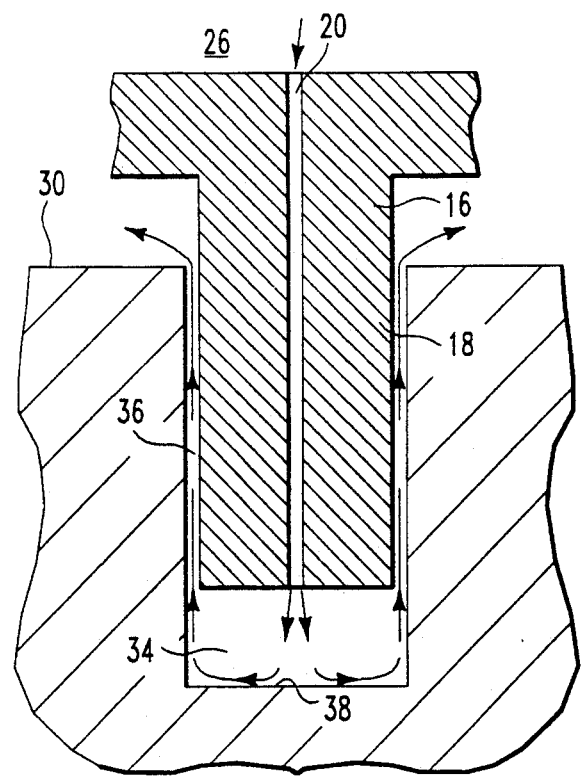
FIG. 2 is an enlarged cross sectional view of the flow pattern in the blind hole cold plate according to the present invention.

An enlarged view of the relationship between nozzle 16 and cavity 34 is shown in FIG. 2. In the prior art cooling arrangements where impingement cooling is utilized, there is usually a large gap between the nozzle and the cavity wall. The present inventors have discovered, however, that in such prior art arrangements, cooling is principally by impingement at surface 38. Very little cooling actually takes place through the side walls of the cavity. The present inventors have further discovered that by making the annular gap 36 small, channel flow cooling can take place at gap 36, thereby enhancing the cooling through the wall of the cavity.

Figure 3:
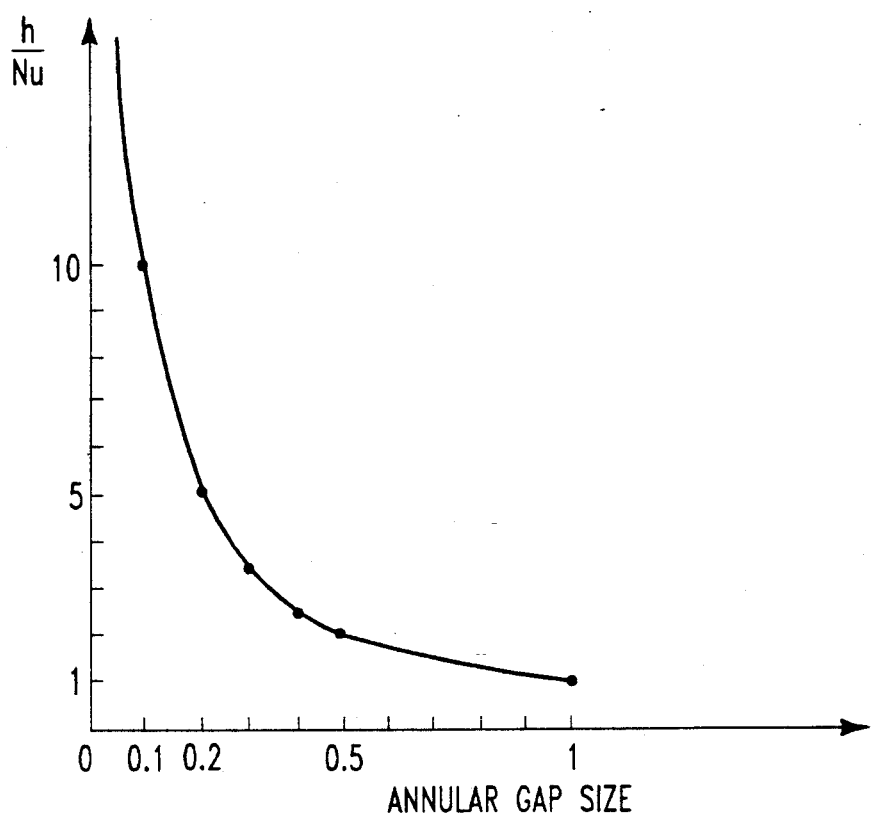
FIG. 3 is a graph illustrating the cooling advantage of the present invention.

The theoretical basis for this conclusion is as follows. The heat transfer for concentric annular ducts can be described by the following equation $$Nu = \frac{h(r_0 - r_1)}{k} \quad (1)$$

where Nu is the Nusselt number, h is the heat transfer coefficient, k is the thermal conductivity of the fluid and $r_o$ to $r_i$ are the outside and inside radii, respectively, of the concentric annular ducts. When the ratio of $r_o$ to $r_i$ is about 0.8 or higher, Nu becomes nearly constant. Since k is constant for the fluid, the heat transfer coefficient must increase as the gap $(r_o - r_i)$ decreases. In FIG. 3, h/Nu is plotted versus gap size. Since Nu is a constant, h increases as the inverse of the gap size. That is, as gap size decreases, greater heat transfer is accomplished. As can be seen from FIG. 3, a gap size of 0.2 mm gives good results but a gap size of 0.1 mm or less gives even better results. Below about 0.1 mm, the curve asymptotically approaches the y-axis.

The inventors have further discovered that by making the conduit portion 20 of the nozzle much smaller than the body portion 18 of the nozzle, heat transfer can be improved even more. For example, with a 4.5 mm diameter cavity 34, a nozzle 16 having a diameter of 4.0 mm, and an annular gap 36 of 0.5 mm, the average heat transfer coefficient h increased from about 0.018 to over 0.03 (watts/mm²°C.) as the conduit portion 20 was decreased from about 2 mm to 1 mm.

In one embodiment of the invention, there will be 1 jet nozzle and 1 cavity per semiconductor device, as shown in FIG. 1. For best cooling efficiency, the jet nozzle and cavity should be centrally located over the semiconductor device. In another embodiment of the invention, there may be more than 1 nozzle and cavity per semiconductor device.

Figure 4:
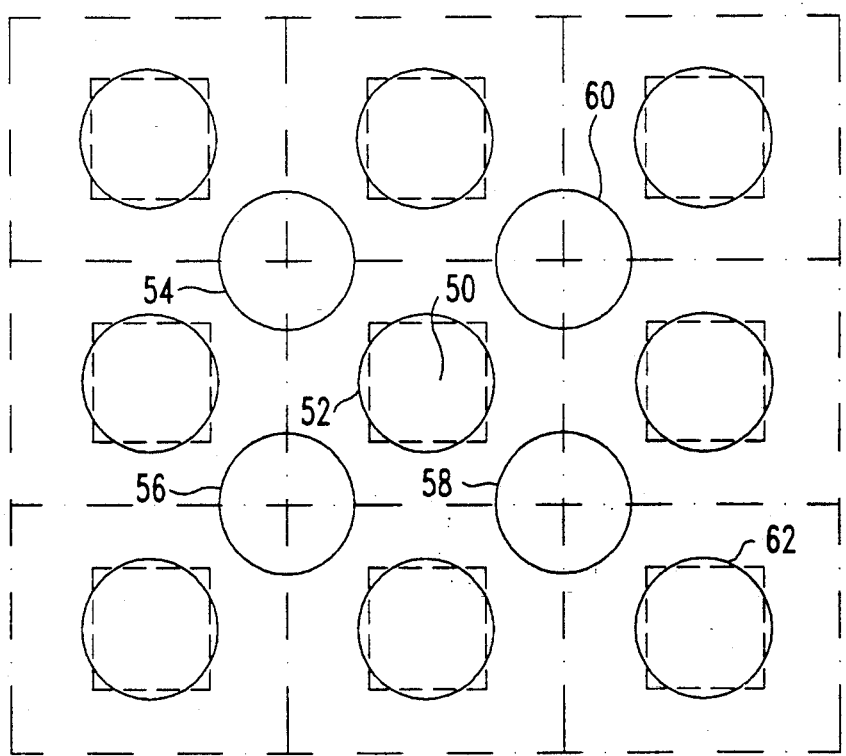
FIG. 4 schematically illustrates one preferred arrangement of the cavities in the blind hole cold plate

Referring now to FIG. 4, there is shown a schematical illustration of a preferred arrangement of the cavities with respect to the semiconductor devices. Considering, for example, semiconductor device 50, there is one cavity 52 centrally located over the semiconductor device 50. However, there are also four other cavities 54, 56, 58, 60 that are shared with semiconductor device 50 and other neighboring devices. Since each of these cavities 54, 56, 58, 60 are shared with four devices, one-fourth of each of the cavities 54, 56, 58, 60 is shared with semiconductor device 50. Added with cavity 52 that is already situated over semiconductor device 50, this brings the total number of nozzles and cavities per semiconductor device to 2 nozzles and 2 cavities. Semiconductor devices that are along the edge of the substrate may have fewer cavities and nozzles. For example, semiconductor device 62 only has one and a quarter cavities and nozzles.

The advantages of the present invention will be more apparent after the following example. A cooling system according to the invention was prepared wherein each cavity 34 was 4.5 mm in diameter, each conduit 20 in the nozzle 16 had a diameter of 1.5 mm, the depth of each cavity 34 was 12 mm, the between the bottom of the nozzle 16 and the impinged surface 38 of the cavity 34 was set at 1.5 mm, and the flow rate was 0.04 gallons per minute per nozzle. The annular gap 36 between the nozzle 16 and the cavity wall was set at either 0.1 mm or 0.5 mm. It was found that the average heat transfer coefficient for the 0.1 mm gap was 0.05 W/mm²°C. and for the 0.5 mm gap was 0.01 W/mm²°C. The results show that the small annular gap has a dramatic effect on the heat transfer characteristics of the cooling system. The advantages of having the small annular gap according to the invention are thus readily apparent.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A blind hole cold plate cooling system comprising:
   a fluid inlet manifold having at least one jet nozzle;
   a heat transfer plate having a first and second principle surface, said first principal surface having at least one complementary cavity receiving the at least one jet nozzle, said second principal surface in removable contact with at least one heat generating device; and
   an annular gap defined by the outer periphery of the at least one jet nozzle and the surface of said complementary cavity wherein the annular gap is on the order of 0.2 mm or less.

2. The cooling system of claim 1 wherein the annular gap is on the order of 0.1 mm or less.

3. The cooling system of claim 1 wherein the at least one jet nozzle comprises a body portion and a conduit portion wherein the conduit portion is much smaller than the body portion.

4. The cooling system of claim 1, wherein there are a plurality of jet nozzles and a complementary number of cavities receiving the jet nozzles.

5. The cooling system of claim 4 wherein the jet nozzles and the complementary cavities are spaced such that there is at least 1 jet nozzle and 1 cavity per heat generating device.

6. The cooling system of claim 5 wherein there are 2 jet nozzles and 2 cavities per heat generating device.

7. The cooling system of claim 4 wherein the jet nozzles and the complementary cavities are spaced such that there is at least 1 jet nozzle and 1 cavity centrally located over each heat generating device and there is additionally at least a portion of a second jet nozzle and a second cavity shared with each heat generating device.

8. The cooling system of claim 7 wherein there are 2 jet nozzles and 2 cavities per heat generating device.

9. A blind hole cold plate cooling system comprising:
at least 1 semiconductor device;
a fluid inlet manifold having at least one jet nozzle;
a heat transfer plate having a first and a second principal surface, said first principal surface having at least one complementary cavity receiving the at least one jet nozzle, the second principal surface being in removable contact with the semiconductor device; and
an annular gap between the outer periphery of the at least one jet nozzle and the surface of said complementary cavity wherein the annular gap is on the order of 0.2 mm or less.

10. The cooling system of claim 9 wherein the annular gap is on the order of 0.1 mm or less.

11. The cooling system of claim 9 wherein the at least one jet nozzle comprises a body portion and a conduit portion wherein the conduit portion is much smaller than the body portion.

12. The cooling system of claim 9 wherein there are a plurality of jet nozzles and a complementary number of cavities receiving the jet nozzles.

13. The cooling system of claim 12 wherein the jet nozzles and the complementary cavities are spaced such that there is at least 1 jet nozzle and 1 cavity per heat generating device.

14. The cooling system of claim 13 wherein there are 2 jet nozzles and 2 cavities per heat generating device.

15. The cooling system of claim 12 wherein the jet nozzles and the complementary cavities are spaced such that there is at least 1 jet nozzle and 1 cavity centrally located over each heat generating device and there is additionally at least a portion of a second jet nozzle and a second cavity shared with each heat generating device.

16. The cooling system of claim 15 wherein there are 2 jet nozzles and 2 cavities per heat generating device.

17. The cooling system of claim 12 wherein there are a plurality of semiconductor devices.

18. The cooling system of claim 9 wherein there is a thermally conductive substance between the semiconductor device and the planar second principal surface.

* * * * *